(12) United States Patent
Yeh et al.

(10) Patent No.: US 7,441,175 B2
(45) Date of Patent: Oct. 21, 2008

(54) TURBO PRODUCT CODE IMPLEMENTATION AND DECODING TERMINATION METHOD AND APPARATUS

(75) Inventors: Nan-Hsiung Yeh, Foster City, CA (US); Yan Li, Tucson, AZ (US)

(73) Assignee: Seagate Technology LLC, Scotts Valley, CA (US)

( * ) Notice: Subject to any disclaimer, the term of this patent is extended or adjusted under 35 U.S.C. 154(b) by 563 days.

(21) Appl. No.: 10/799,232

(22) Filed: Mar. 12, 2004

(65) Prior Publication Data

US 2005/0204256 A1    Sep. 15, 2005

(51) Int. Cl.
    *H03M 13/00*    (2006.01)
(52) U.S. Cl. .................. 714/758; 714/785
(58) Field of Classification Search .......... 714/758, 714/755, 785
    See application file for complete search history.

(56) References Cited

U.S. PATENT DOCUMENTS

| | | | |
|---|---|---|---|
| 5,859,859 A | 1/1999 | Kim | |
| 6,526,538 B1 | 2/2003 | Hewitt | |
| 6,591,390 B1 * | 7/2003 | Yagyu | 714/755 |
| 6,606,725 B1 | 8/2003 | Wang | |
| 6,950,977 B2 * | 9/2005 | Lavi et al. | 714/758 |
| 2002/0026615 A1 * | 2/2002 | Hewitt et al. | 714/752 |
| 2003/0053493 A1 * | 3/2003 | Graham Mobley et al. | 370/538 |
| 2003/0106012 A1 | 6/2003 | Hewitt | |

FOREIGN PATENT DOCUMENTS

| | | |
|---|---|---|
| WO | WO00/19616 | 4/2000 |
| WO | WO03/005591 A1 | 1/2003 |

* cited by examiner

*Primary Examiner*—M. Mujtaba K Chaudry
(74) *Attorney, Agent, or Firm*—Cesari and McKenna, LLP

(57) ABSTRACT

A method of decoding a turbo product code (TPC) code word comprises iteratively decoding the TPC code word using an iterative decoder. The method further comprises terminating the iterative decoding when the TPC code word satisfies a cyclic redundancy check (CRC). The TPC code word can include a plurality of square code blocks of user data, with CRC data bits appended to one of the plurality of code blocks instead of replacing user data within the code blocks. Apparatus for implementing the method are also provided.

20 Claims, 12 Drawing Sheets

SNR = 6.4dB, 1600 codewords were simulated*

| Termination Criterion | # of Error Events | # of wrong bits in those error events |
|---|---|---|
| Parity check Equation | 44 | 4 10 4 14 6 2 4 4 4 4 1 8 4 4 6 8 4 1 4 4 4 6 12 2 4 2 4 4 4 4 2 10 3 4 4 4 4 6 4 4 8 4 4 1 4 |
| CRC | 5 | 1, 1, 2, 3, 1 |

* SOVA/TPCSPC system With fixed-point calculation.

FIG. 8

TURBO PRODUCT CODE IMPLEMENTATION AND DECODING TERMINATION METHOD AND APPARATUS

FIELD OF THE INVENTION

The present invention relates to Turbo Product Code (TPC). More particularly, the present invention relates to Cyclic Redundancy Check (CRC) and/or Error Correcting Code (ECC) usage with a TPC.

BACKGROUND OF THE INVENTION

Turbo code using iterative decoding algorithms has been shown to give a significant performance advantage over existing partial response maximum likelihood (PRML) channels. Turbo Product Code (TPC) with single parity check (TPC/SPC), which belongs to a family of turbo codes, presents the potential for less complex implementations with minimal performance losses. See for example J. Li, K. R. Narayanan, E. Kurtas, and C. N. Georghiades, "On the Performance of High-Rate TPC/SPC Codes and LDPC codes over Partial Response Channels", *IEEE Trans. Commun.*, Vol. 50, pages 723-734, May 2002. TPC generally utilizes "square" code words (i.e., code words having the same number of rows and columns of bits), with each code word being comprised of square code blocks. An example of a 512 byte (4,096 bit) code word is a code word having four 32 bits by 32 bits code blocks.

In telecommunications and other technical fields which utilize predetermined sized TPC code words to transmit user data, it is typical for Error Correcting Code (ECC) data, Cyclic Redundancy Check (CRC) data and/or parity check data to replace a portion of the user data in the TPC code blocks. For a predetermined sized code word or packet of data, these added ECC, CRC or parity data bits reduce the quantity of user data communicated in the packet. However, in some fields, such as in mass storage applications, the user data block typically must be of a fixed size. For example, in many mass storage applications, a user data sector must include 512 bytes of user data. Therefore, to maintain the fixed quantity of user data, insertion of ECC data, CRC data and/or parity data in the TPC is difficult.

Also, when using a TPC to encode data for transmission or storage, it is common to utilize a soft decision algorithm in conjunction with the TPC decoder to iteratively decode the data. Examples of soft decision algorithms include Soft Output Viterbi Algorithms (SOVAs) and Bahl, Cocke, Jelinek, and Raviv (BCJR) algorithms. Determining when to terminate the iterative decoding between the soft decision algorithm and the TPC decoder can be problematic. The iterative decoding can be terminated when parity check equations are satisfied. However, even with the parity check equations satisfied, error bits frequently remain in the decoded code blocks of each code word.

Embodiments of the present invention provide solutions to these and/or other problems, and offer other advantages over the prior art.

SUMMARY OF THE INVENTION

A method of decoding a turbo product code (TPC) code word comprises iteratively decoding the TPC code word using an iterative decoder. The method further comprises terminating the iterative decoding when the TPC code word satisfies a cyclic redundancy check (CRC). The TPC code word can include a plurality of square code blocks of user data, with CRC data bits appended to one of the plurality of code blocks instead of replacing user data within the code blocks. Apparatus for implementing the method are also provided.

In some embodiments, iteratively decoding the TPC code word comprises iteratively decoding the TPC code word using a soft decision algorithm (such as a soft output viterbi algorithm (SOVA) or a Bahl, Cocke, Jelinek, and Raviv (BCJR) algorithm) and a TPC decoder. In some embodiments, the TPC code word is a single parity check TPC code word (TPC/SPC).

In some embodiments, the method further comprises terminating the iterative decoding prior to the TPC code word satisfying the CRC if a predetermined number of iterations between the soft decision algorithm and the TPC decoder have been completed.

In some embodiments, prior to the step of iteratively decoding the TPC code word, the method further comprises appending CRC data bits to one of the plurality of code blocks of the TPC code word. After appending the CRC data bits, a row and a column of parity bits can be added to each of the plurality of code blocks of the TPC code word. Other features and benefits that characterize embodiments of the present invention will be apparent upon reading the following detailed description and review of the associated drawings.

BRIEF DESCRIPTION OF THE DRAWINGS

FIG. 3-1 is a diagrammatic illustration of an encoding scheme for a TPC code word with a single row or column of Cyclic Redundancy Check (CRC) and/or Error Correcting Code (ECC) bits added to one of the code blocks.

FIG. 3-2 is a diagrammatic illustration of an encoding scheme for a TPC code word with a row or column of CRC and/or ECC bits added to two of the code blocks.

FIG. 3-3 is a diagrammatic illustration of an encoding scheme for a TPC code word with a row or column of CRC and/or ECC bits added to three of the code blocks.

FIG. 3-4 is a diagrammatic illustration of an encoding scheme for a TPC code word with a row or column of CRC and/or ECC bits added to four of the code blocks.

FIG. 4 is a block diagram illustrating a system and method of TPC encoding and decoding in accordance with embodiments of the invention.

FIGS. 6-1 and 6-2 are diagrammatic illustrations of iteration termination techniques based respectively on parity check equations and CRC equations.

FIG. 8 is a table illustrating performance for the two iteration termination criteria illustrated in FIGS. 6-1 and 6-2.

DETAILED DESCRIPTION OF ILLUSTRATIVE EMBODIMENTS

Figure 1:
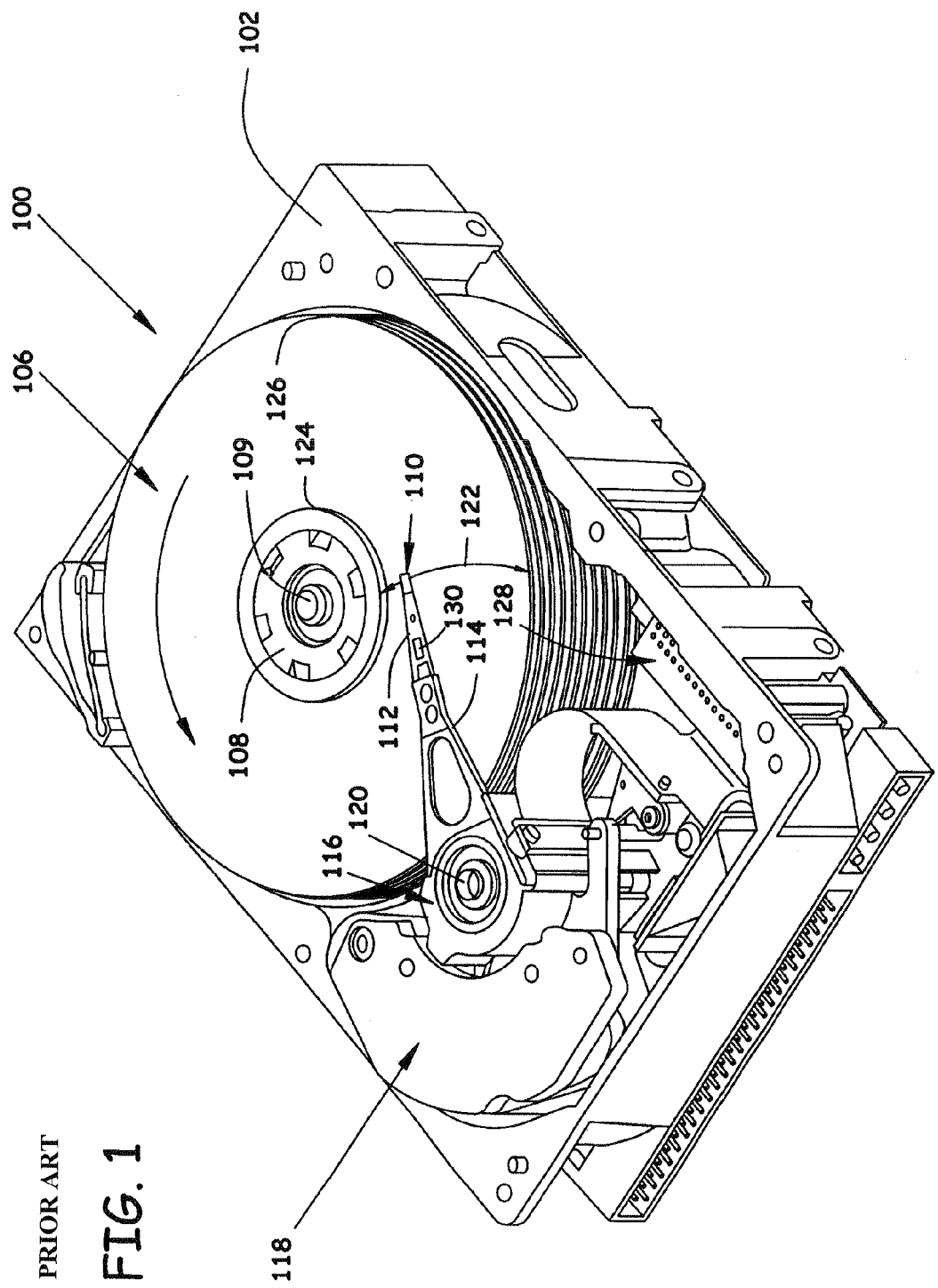
FIG. 1 is an isometric view of a disc drive.

Referring to FIG. 1, a perspective view of a disc drive 100 is shown. The present invention is useful in implementing turbo product code (TPC) to encode and decode user data in disc drive 100. In accordance with a first aspect of the invention, a method is provided for terminating iterative decoding of the TPC code words between a soft decision algorithm (such as a Soft Output Viterbi Algorithm (SOVA) or a Bahl, Cocke, Jelinek, and Raviv (BCJR) algorithm) and a TPC decoder. In accordance with a second aspect of the invention, a technique for adding Cyclic Redundancy Check (CRC) and/or Error Correcting Code (ECC) data to TPC code words without reducing the quantity of user data is provided. The acronym "CRC" is also frequently used to denote a "Cyclic Redundancy Code." Used in this manner, the "Cyclic Redundancy Check" can be referred to as a "Cyclic Redundancy Code check" or a "CRC check."

Disc drive 100 includes a housing with a base 102 and a top cover (not shown). Disc drive 100 further includes a disc pack 106, which is mounted on a spindle motor (not shown), by a disc clamp 108. Disc pack 106 includes a plurality of individual discs, which are mounted for co-rotation about central axis 109. Each disc surface has an associated disc head slider 110 which is mounted to disc drive 100 for communication with the disc surface.

Sliders 110 support MR heads for reading data from the disc surface. The MR heads include MR readers or sensors, or in the alternative, the MR heads can be considered to be the MR readers. In the example shown in FIG. 1, sliders 110 are supported by suspensions 112 which are in turn attached to track accessing arms 114 of an actuator 116. The actuator shown in FIG. 1 is of the type known as a rotary moving coil actuator and includes a VCM, shown generally at 118. VCM 118 rotates actuator 116 with its attached head 110 about a pivot shaft 120 to position head 110 over a desired data track along an arcuate path 122 between a disc inner diameter 124 and a disc outer diameter 126. VCM 118 is driven by servo electronics (diagrammatically included within electronics 128) based on signals generated by heads 110 and a host computer (not shown). A micro-actuator 130, which provides fine position control of heads 110, is used in combination with VCM 118 that provides relatively coarse positioning of heads 110.

The methods of the present invention are practiced, for example, in channel circuitry (diagrammatically included within electronics 128) of disc drive 100. While disc drive 100 is shown in FIG. 1 for illustrative purposes, the present invention is not limited to use with disc drive data storage systems. Instead, the present invention applies to other types of data storage systems which utilize TPC, to communication systems which utilize TPC, to other apparatus or systems which utilize TPC, and to methods and apparatus for encoding and decoding TPC.

Figure 2:
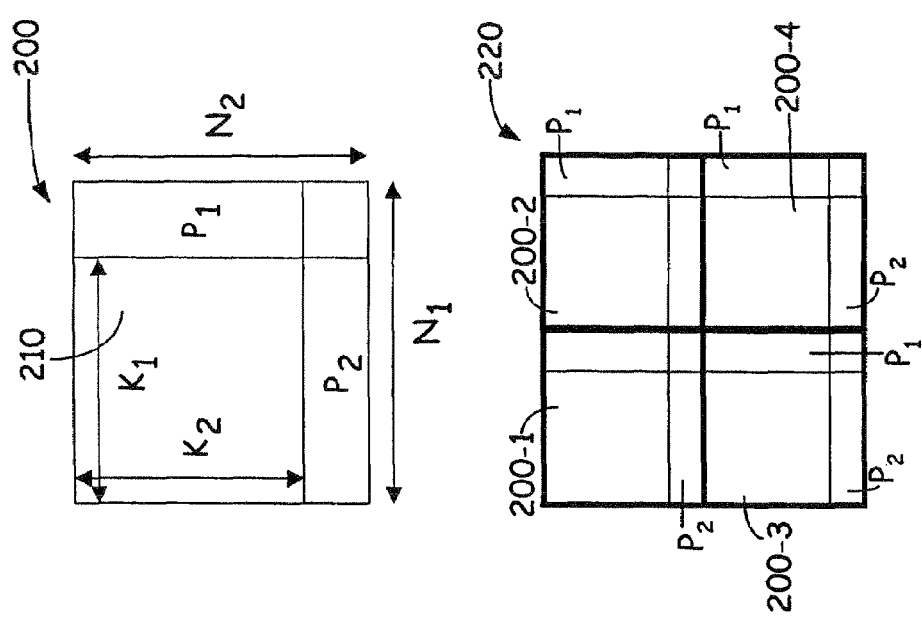
FIG. 2 is a diagrammatic illustration of a Turbo Product Code (TPC) code block and a TPC code word.

FIG. 2 is a diagrammatic illustration of a TPC code word 220 which is comprised of a number of square code blocks 200. As shown in FIG. 2, code word 220 includes four code blocks 200-1 through 200-4. In this example, each code block 200 includes a user data portion 210 having dimensions of $K_1$ bits by $K_2$ bits, where $K_1=K_2$. In one particular example embodiment in which each code word 220 is to contain 512 bytes of user data, $K_1$ and $K_2$ are equal to 32 bits.

Each code block 200 can include $P_1$ columns of parity bits and $P_2$ rows of parity bits. When TPC code word 220 is a two-dimensional product code based on a single parity check (TPC/SPC), then $P_1=P_2=1$, resulting in the overall dimensions of each code block being $N_1=N_2=33$. The resulting code rate in this example is 0.94. The four code blocks 200-1 through 200-4 are concatenated and interleaved to produce one TPC/SPC code word. The code word length is 4,096 user bits (4*32*32=4,096) or 4,356 channel bits (4*33*33=4,356).

When adding CRC bits to a TPC (for example a TPC/SPC) code word, any addition of CRC bits has to occur before the insertion of the rows and columns $P_1$ and $P_2$ of parity bits in order to obtain the protection from the TPC. In other words, CRC bits must also be added before the TPC encoding. Further, with the addition of a few CRC bits, the remaining user data space is less than the dictated user data sector length (for example 512 bytes in typical data storage systems) and the code block length required in the TPC. These same implementation issues also occur with the addition of ECC bits.

In accordance with embodiments of the present invention, a CRC/ECC implementation scheme or method is proposed for use with TPC/SPC code words. The proposed methodology provides the ability to maintain a predetermined user data size in each code word, while adding CRC bits, ECC bits and parity bits. Encoding schemes for this methodology are illustrated diagrammatically in FIGS. 3-1 through 3-4.

Using the proposed methodology, the ECC/CRC data bits are appended to the user data, instead of replacing portions of the user data as has conventionally been the case. Since ECC and CRC encoding typically requires little overhead, in the embodiment illustrated in FIG. 3-1, one additional row or column 305 of CRC data (and also ECC data if desired) is added to one of user data code blocks 210-1 through 210-4 to accommodate four extra bytes. As shown by way of example in FIG. 3-1, a row or column 305 of CRC/ECC bits is appended to user data block 210-3. This results in the code word 300 having a total size which is greater than the desired data size which is to be maintained. In the example of a data storage system in which the user data must be in 512 byte data blocks, code word 300 is now larger than 512 bytes to maintain the 512 byte user data requirement.

Figures 1, 3:
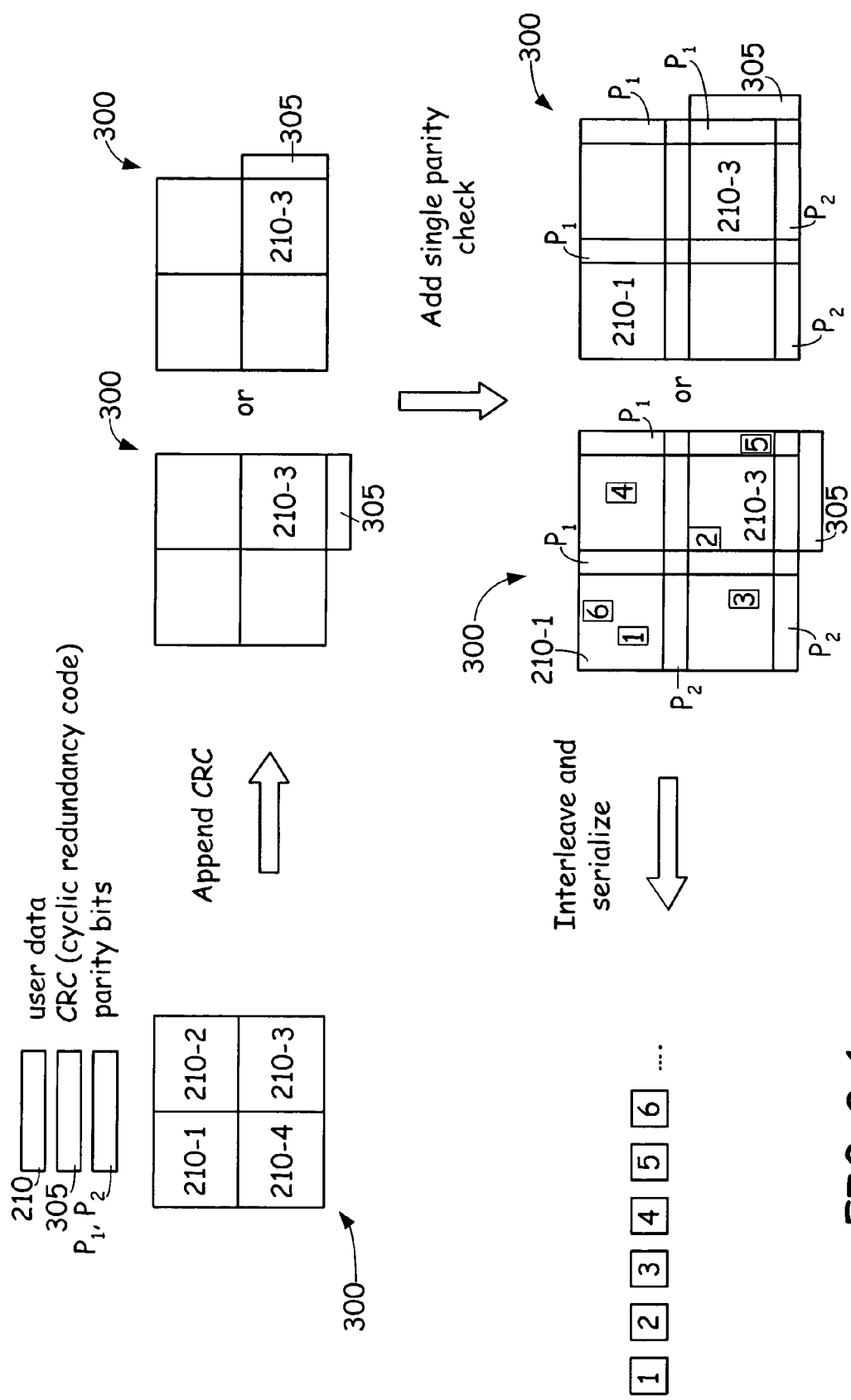
Figures 2, 3:
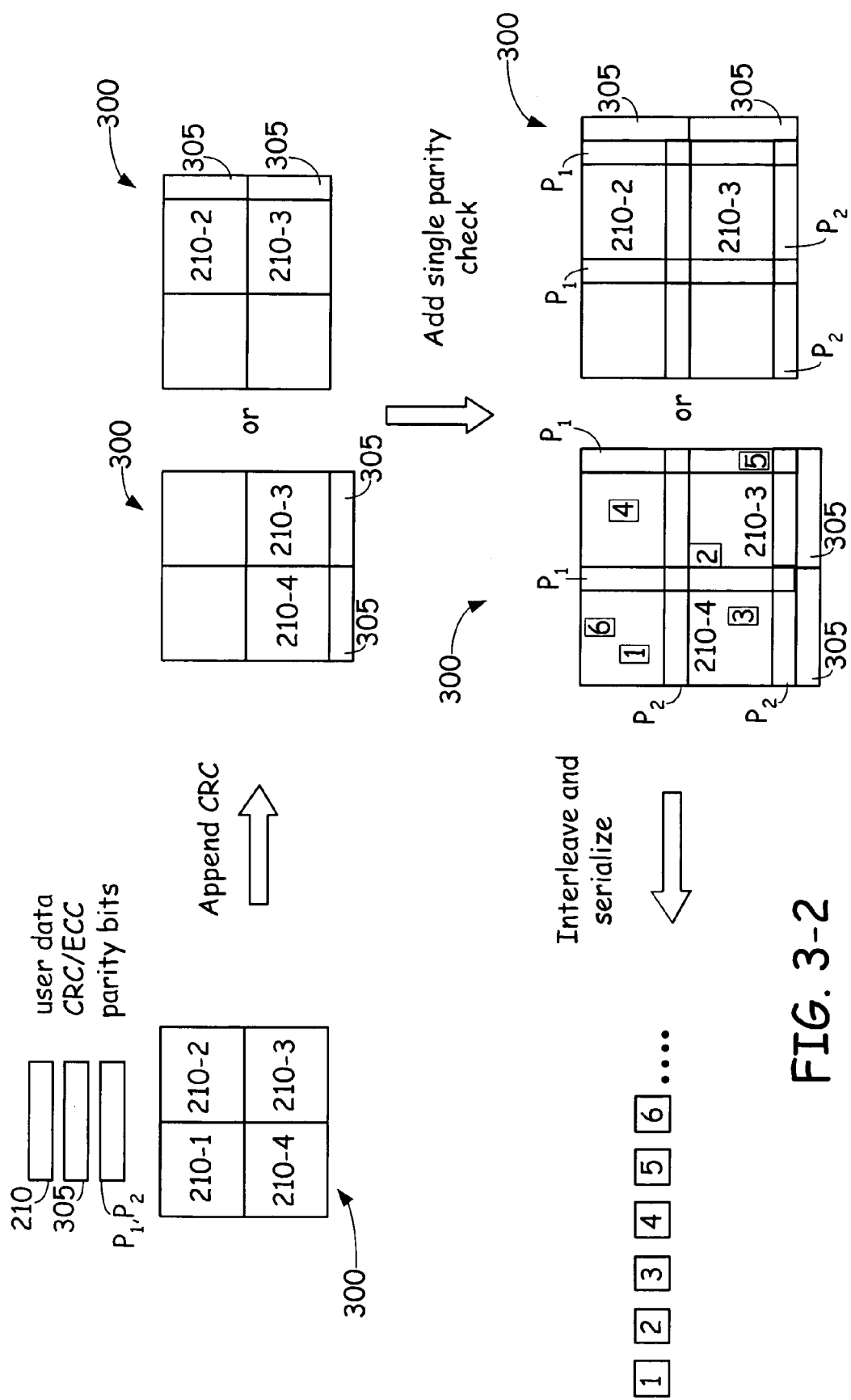
Figure 3:
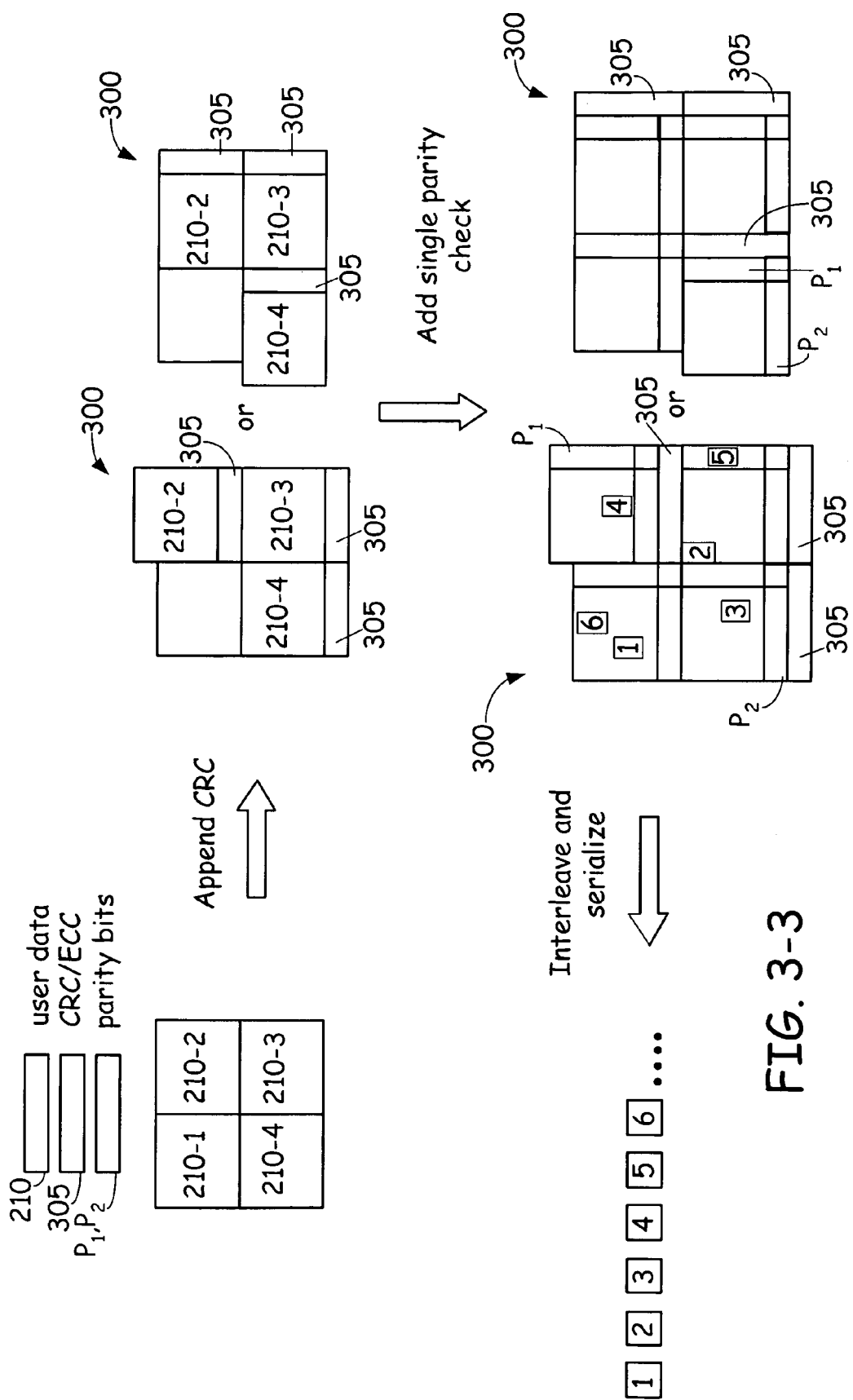

Next, a column $P_1$ and a row $P_2$ of parity bits are added to each of code blocks 210-1 through 210-4. This is also in addition to, instead of in place of, the desired quantity of user data. Again, the resulting TPC/SPC code word is now no longer in the form of a square block, as has conventionally been the case. Next, the code blocks, which no longer all have exactly the same length, are interleaved and serialized to form one code word with integrated user data bits, CRC/ECC bits, and parity check bits. In FIG. 3-1, the interleaving process is represented by the serialized bits 1-6 corresponding to various bit locations within each code word 300.

Figures 3, 4:
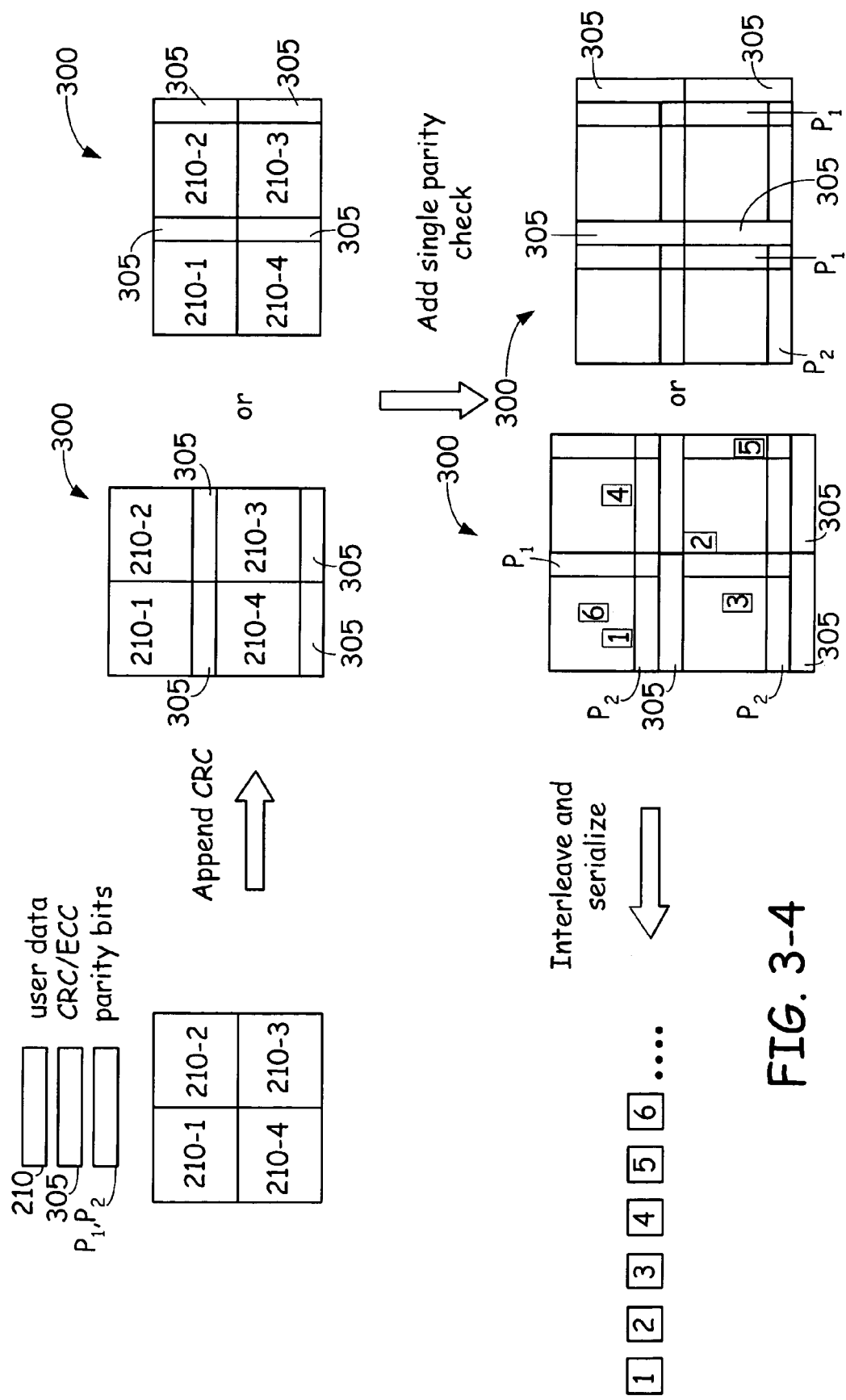
Figure 4:
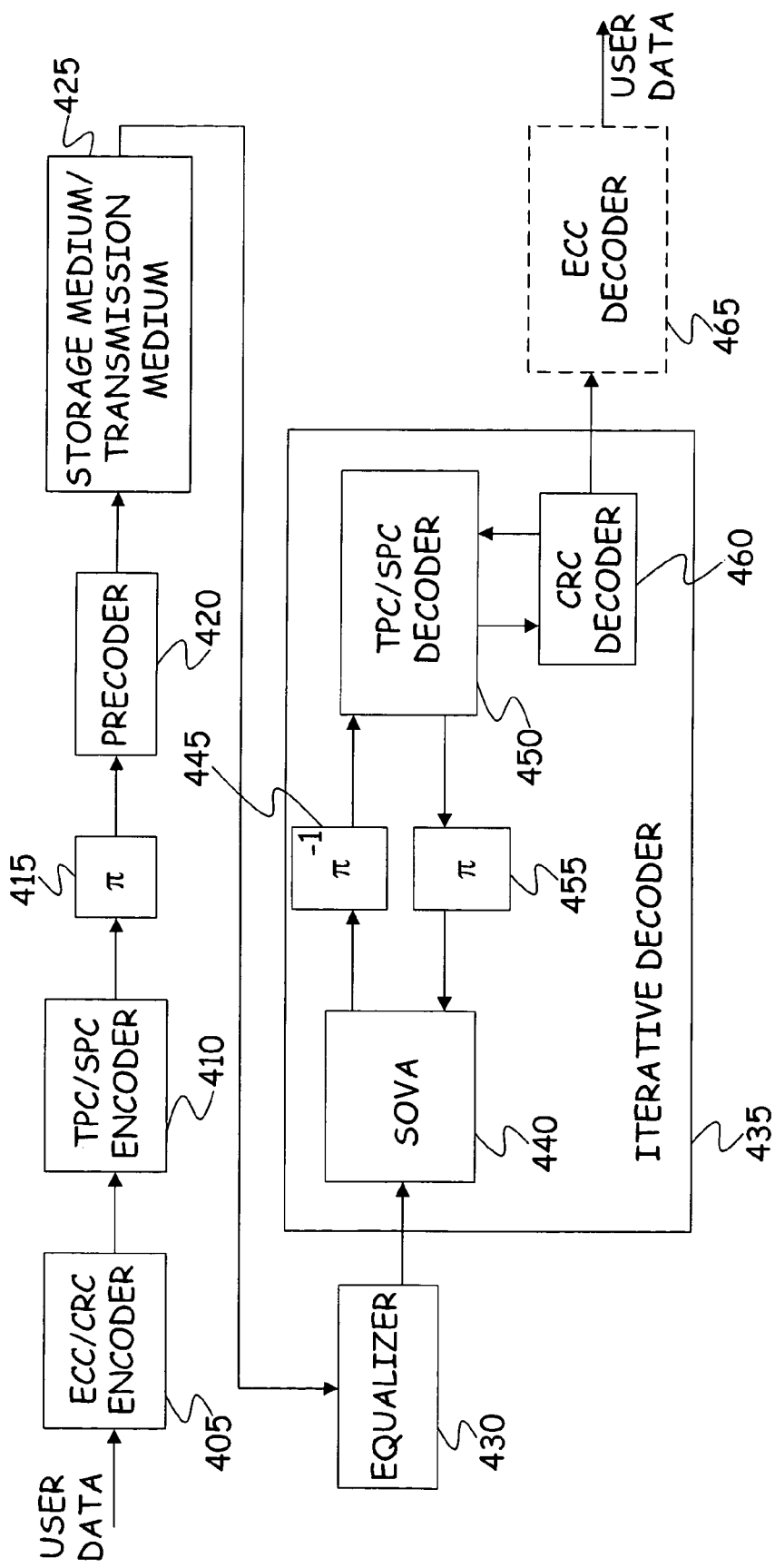

FIGS. 3-2 through 3-4 illustrate encoding schemes for a TPC/SPC code word 300 in which additional CRC/ECC bits are required. As seen in FIGS. 3-2 through 3-4 respectively, a row or column 305 of CRC/ECC bits can be appended to any or all of the multiple code blocks as required. After appending the CRC/ECC bits to the desired number of code blocks, a single row and column of parity bits is added to each of the code blocks. In each of these embodiments, the code word having appended CRC/ECC bits and parity bits added is then interleaved and serialized. Also, in each of these embodiments, the addition of CRC bits, ECC bits and parity bits did not reduce the original quantity of user data in the code word.

Referring now to FIG. 4, shown are a system 400 and corresponding methods of implementing ECC and CRC in a TPC/SPC based communication or storage system. For example, system 400 can be a channel integrated chip (IC) or other circuitry configured to implement the methods of the present invention. As will be discussed in detail below, FIG. 4 also illustrates a further concept of the present invention in which a CRC test is used as a criteria for terminating the iterative decoding process. This further aspect of the invention is also described with reference to FIGS. 5-9.

As shown in FIG. 4, user data is provided to ECC/CRC encoder 405. Encoder 405 adds the ECC and CRC data to the user data prior to encoding using TPC/SPC encoder 410. The combined data and ECC/CRC bits are then encoded into a TPC/SPC format. For example, encoder 410 can place the data and ECC/CRC bits into code word formats such as the ones illustrated in FIGS. 3-1 through 3-4. It must be noted that, while encoder 410 is illustrated as being a TPC/SPC encoder, encoder 410 can be any type of TPC encoder, and is not limited to a TPC encoder which implements an SPC.

The TPC/SPC encoded user data and ECC/CRC data bits are then provided to interleaver block or circuitry 415 which scrambles the locations (order) of the bits of the code blocks which make up the code word. The interleaved code word is then provided to precoder 420 which precodes the code word using any of a variety of well-known techniques which aid in avoiding error propagation. The scrambled and precoded bits are then provided to storage medium or transmission medium 425. In embodiments in which the present invention is used in a data storage system, storage medium 425 can be a data storage disc or other storage medium on which the TPC/SPC encoded data is stored. In order to store the encoded data on the storage medium, and in order to retrieve the stored encoded data from the storage medium, block 425 in FIG. 4 also represents a data head or other transducer which aids in this process. In other embodiments, block 425 represents a transmission medium over which the encoded data is transmitted. In these embodiments, block 425 would also represent the corresponding transmitters and receivers to aid in the transmission of the encoded data.

During read back or receipt of the encoded data, an electrical signal indicative of the encoded data is generated and provided to equalizer 430 for conversion to a specific desired spectrum or target shape. In the equalizer circuit or block 430, the signal can be sampled at a baud rate, with the sampled values sent to the soft decision algorithm implementing block or circuitry 440 of iterative decoder 435. In exemplary embodiments, the invention is described with reference to the soft decision algorithm being a SOVA. However, the present invention is not limited to use with a SOVA, but rather applies to iterative decoding between a soft decision algorithm (such as a SOVA or a BCJR algorithm) and a TPC decoder.

As is well known in the art, the SOVA 440 is a sequence detector which considers not only the value of a current bit, but also the values of entire sequences of bits. Generally speaking, the SOVA considers which of multiple possible sequences is the maximum likelihood sequence corresponding to a particular code block or code word. Thus, the SOVA outputs with (or associated with) each possible sequence a probability of that sequence (or of the particular bits in that sequence) being correct. This information is provided through de-interleaver 445 to TPC/SPC decoder 450. TPC/SPC decoder 450 places all of the de-interleaved bits into the code blocks, then looks at each code block to minimize errors. In some embodiments, the TPC/SPC decoder uses the probabilities of whether each bit is a one or a zero provided by the SOVA 440. The TPC decoder 450 then redefines the probability for each of these bits being a one or a zero, and passes this information back to the SOVA 440 through interleaver circuitry 455 for a repeat of the process. In some embodiments, TPC/SPC decoder 450 analyzes parity check equations for each code block and uses this information to re-define the probabilities which it passes back to SOVA 440. Using an iterative decoding process such as this, it is possible to improve the bit error rate (BER) considerably.

One issue which must be resolved in iterative decoder 435 relates to when the iterative process should be terminated. Using one method, the iterative decoding process between SOVA 440 and decoder 450 terminates when all of parity check equations are satisfied. Another iteration termination criteria which can be used instead of, or in conjunction with, the parity check equation criteria is to set a maximum number of iterations which can be completed prior to termination. For example, TPC/SPC decoder 450 can be configured to terminate the iterative decoding process once thirty iterations have been completed.

Each of these first two methods of terminating the iterative decoding process present disadvantages if used alone or together. For example, using a preset maximum number of iterations presents the potential for inefficient usage of processing power if the iterations continue after the maximum likelihood results have been established using the SOVA 440 and TPC/SPC decoder 450 in the iterative process. Terminating the iterative process when all of the parity check equations are satisfied can result in a more efficient use of processing power, but presents the opportunity for leaving errors in the decoded data. It is understood that even though parity check is chosen as the criterion for iteration termination, it is still preferred to set a maximum number of iterations to avoid detector hang-up in the case when the parity check is never satisfied throughout the iterations.

Figures 1, 6:
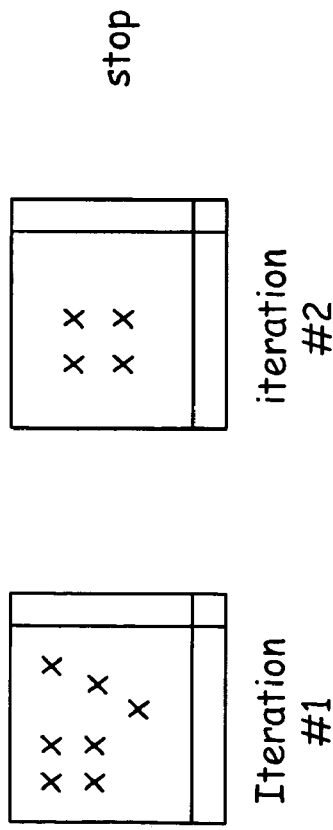
Figures 2, 6:

Referring for the moment to FIG. 6-1, shown is the number of TPC/SPC errors per iteration for an example in which termination of the iterative decoding process occurs once the parity check equations are satisfied. As shown in FIG. 6-1, after one iteration, seven error bits where found in a code block. Since the parity check equations were not satisfied, a second iteration between decoder 450 and SOVA 440 occurred, reducing the number of error bits to four. However, because of the placement of the error bits within the code block or code word, the parity check equations are satisfied after the second iteration, and the iterative process is terminated, despite the fact that error bits remain.

Referring back to FIG. 4, in accordance with the present invention iterative decoder 435 further includes CRC decoder 460. CRC decoder 460 and TPC/SPC decoder 450 are configured to provide an improved method of terminating the iterative decoding process between SOVA and decoder 450. After each iteration, CRC decoder 460 performs a CRC to determine whether the CRC equations are satisfied. If the CRC equations are satisfied, the iterative decoding process is terminated. If the CRC equations are not satisfied, another iteration of decoding between decoder 450 and SOVA 440 is performed. This prevents inefficient use of processing resources, while insuring that the errors remaining in the decoded TPC/SPC code word are minimized.

Referring for the moment to FIG. 6-2, shown is an example of the number of error bits remaining after each iteration using CRC decoder 460 to determine when the iteration process is to be terminated. As was the case in FIG. 6-1, after the first and second iterations, the number of error bits is reduced to four. However, in this embodiment, even though parity check equations may be satisfied after the second iteration, CRC equations are not satisfied, and the iterative process continues. After the Nth iteration, the iterative decoding process terminates once the CRC equations are satisfied. In the example shown in FIG. 6,-2, this results in no error bits remaining in the decoded code word.

After the iterative decoding is terminated, the decoded data can optionally be provided to an ECC decoder 465. ECC decoder 465 is not required in all embodiments because the number of error bits after the iterative decoding process will be minimal using the CRC termination criteria. However, in other embodiments, inclusion of ECC decoder 465 is desirable, particularly if different termination criteria are used. For example, if a predetermined maximum number of iterations is used to terminate the iterative process in the event that the CRC equations are not satisfied, inclusion of ECC decoder 465 to correct remaining errors can still be beneficial. As will be understood, if ECC decoder 465 is not included, then ECC bits need not be added to the code words prior to encoding.

Figure 5:
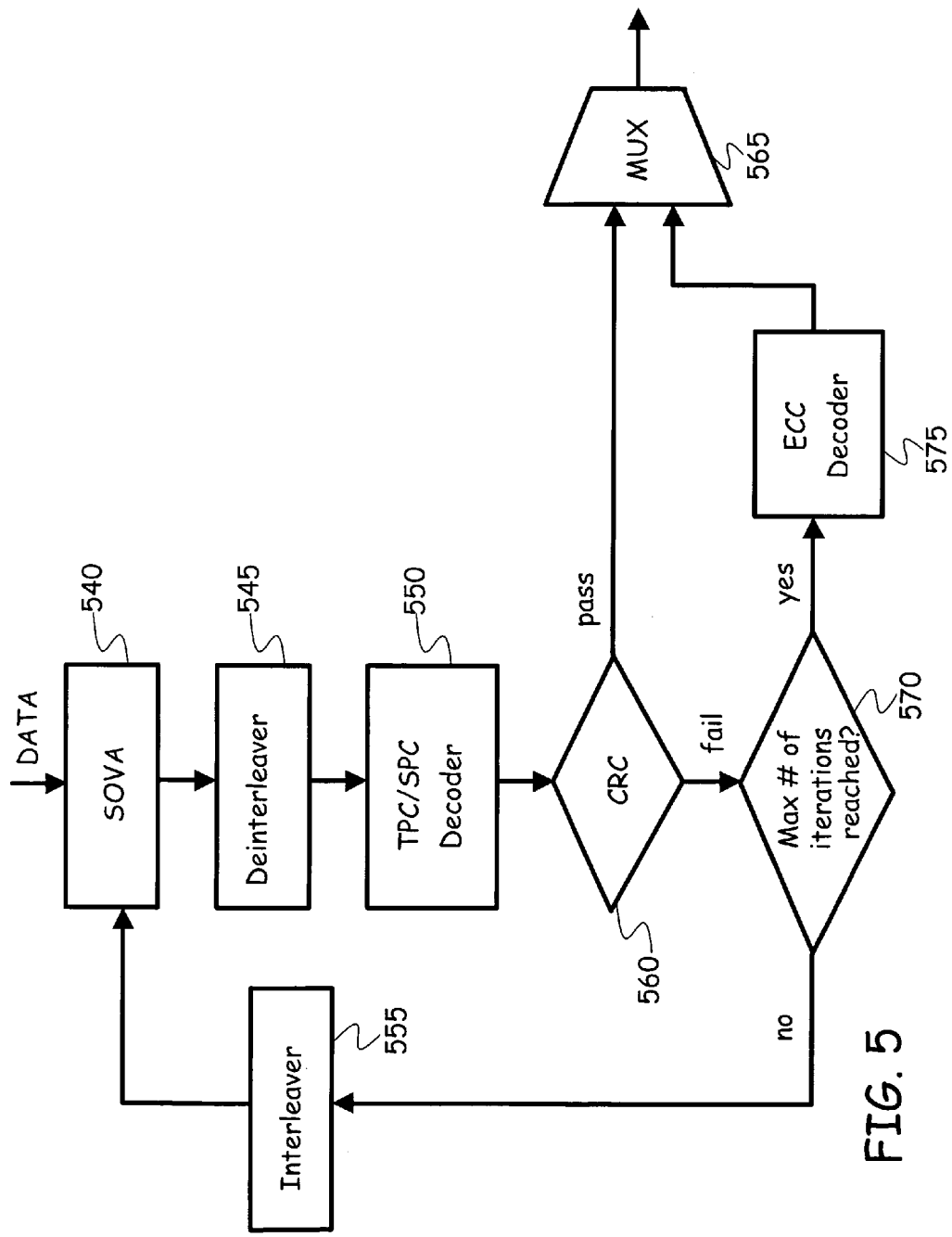
FIG. 5 is a flow diagram illustrating iterative TPC decoding methods in accordance with the present invention.

FIG. 5 is a flow diagram 500 illustrating the method of terminating iterative decoding discussed with reference to the apparatus shown in FIG. 4. FIG. 5 also illustrates an additional (or more specific) embodiment of the apparatus shown in FIG. 4. As shown in block 540, a SOVA is used to generate probabilities corresponding to different sequences of bits in the TPC/SPC code word. The code word is de-interleaved as shown in block 545, and decoded using a TPC/SPC decoder as illustrated at block 550. In other embodiments, decoding at block 550 uses a TPC decoder, but not necessarily an TPC/SPC decoder. The TPC decoding in block 550 utilizes the probability information provided by the SOVA in block 540 as discussed above. As shown at block 560, if the decoded code word passes the CRC, the iterative decoding process is terminated. This can be implemented by passing the message data indicative of the decoded code word to multiplexing device 565 and providing appropriate control signals for multiplexing device 565 to pass the data to its output. Like the other components of the apparatus illustrated in FIG. 4, multiplexing device 565 can be implemented in an integrated chip, using discrete components, in firmware, or in software programming of a microprocessor other device.

As shown at block 570, if the CRC has failed, a determination is made as to whether a predetermined maximum number of iterations has been reached. If the predetermined maximum number of iterations has been reached, then at block 575 ECC decoding can be implemented to correct any remaining errors if desired. The output of the ECC decoder is then provided to multiplexing device 565, along with appropriate control signals causing multiplexing device 565 to pass the data to its output. If the maximum number of iterations has not been reached, then the code word is again provided to the SOVA, after being again interleaved at block 555, for an additional decoding iteration.

Figure 7:
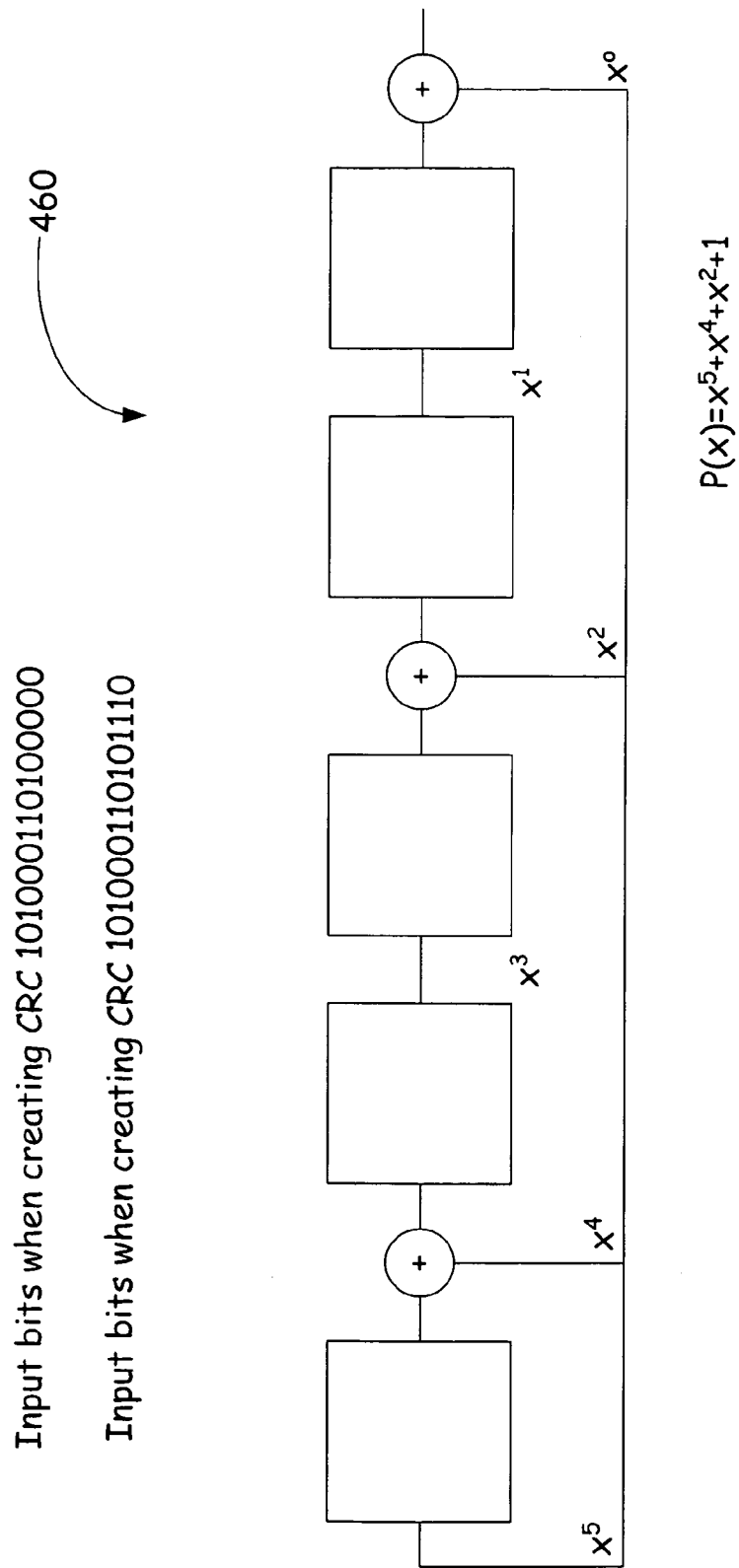
FIG. 7 is a block diagram illustrating circuitry for implementing a CRC code.

FIG. 7 is a block diagram illustrating an example embodiment of CRC decoder 460. In this example embodiment, the code is specified by a polynomial, for example $P(x)=x^5+x^4+x^2+1$. The encoding is implemented using a shift register with feedback as shown in FIG. 7.

In the example shown, when creating the CRC, after input bits of "1010001101", the bits "00000" are appended at the end of the input stream to flush out the content of the register. The content of the register is then "01110". When checking the CRC, the input stream "101000110101110" is fed into the shift register. If the contents of the register after the sequence has passed through the register is then "00000", the CRC equation is satisfied, and the data has been decoded properly.

Referring now to FIG. 8, shown is a table illustrating performance for the two iteration termination criteria illustrated in FIGS. 6-1 and 6-2 and discussed above. As can be seen in the table of FIG. 8, with a simulation of 1,600 code words during a verification process, termination of the iterative decoding process using parity check equations as the termination criteria resulted in 44 error events. The number of bits wrong in those error events were significant, as is shown in the third column of the table. In contrast, when the CRC equations are used as the termination criteria for the iterative decoding process, only five error events occurred. Further, as shown in the third column of the table, the number of wrong bits in each of those error events was small relative to the error events occurring using parity check equations.

Figure 9:
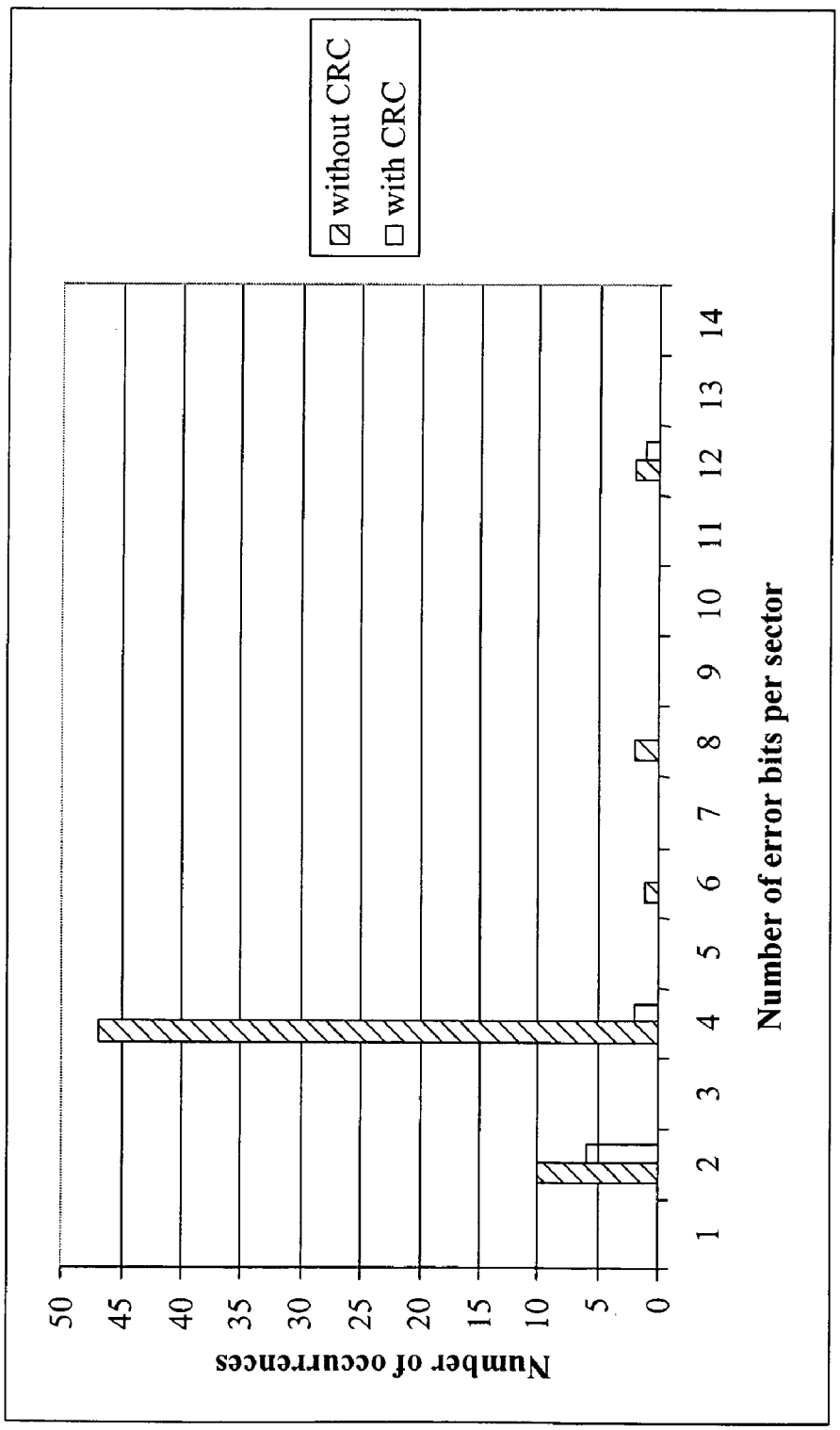
FIG. 9 is a chart illustrating reduction of the burst error length with CRC termination of the iterative decoding.

The improved results using the CRC termination criteria is further illustrated in FIG. 9 which demonstrates a burst error length profile for each of the two termination criteria using experimental data. As can be seen in the chart of FIG. 9, without CRC termination, there are a considerable number of 2-bit per sector and 4-bit per sector types of errors. However, with CRC termination of the iterative process, there are few of these types of errors because most of the errors are eliminated prior to termination.

In accordance with the aspects of the present invention, it has been shown that using a CRC to terminate the iterative decoding process of a TPC code word is a highly effective method of improving efficiency and performance. Further, it has been shown that CRC and ECC data bits can be added to the fixed number of bytes of user data, while still made compatible with TPC/SPC code blocks. These concepts of the present invention are extendible to other sector and TPC code block lengths for future recording systems or communication systems.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the encoding and decoding systems while maintaining substantially the same functionality without departing from the scope and spirit of the present invention. In addition, although the preferred embodiment described herein is directed to a data storage system, it will be appreciated by those skilled in the art that the teachings of the present invention can be applied to communication and other systems, without departing from the scope and spirit of the present invention.

What is claimed is:

1. A method comprising:
    iteratively decoding a turbo product code (TPC) code word by:
        i) generating a probability indicative parameter, using a soft decision algorithm, for each of a plurality of sequences of bits from the TPC code word;
        ii) de-interleaving the TPC code word to generate a de-interleaved TPC code word;
        iii) decoding the de-interleaved TPC code word, using a TPC decoder, as a function of the probability indicative parameter from the soft decision algorithm to generate a decoded TPC code word; and
        iv) re-interleaving the decoded TPC code word for use by the soft decision algorithm in updating the probability indicative parameter for each of the plurality of sequences of bits; and
    terminating the iterative decoding when the TPC code word satisfies a cyclic redundancy check (CRC).

2. The method of claim 1, wherein the soft decision algorithm is a Bahl, Cocke, Jelinek, and Raviv (BCJR) algorithm.

3. The method of claim 1, wherein the soft decision algorithm is a soft output viterbi algorithm (SOVA).

4. The method of claim 1, wherein iteratively decoding the TPC code word further comprises iteratively decoding a TPC code word with single parity check (TPC/SPC).

5. The method of claim 1, further comprising:
    performing the CRC on the decoded TPC code word.

6. The method of claim 1, further comprising:
    terminating the iterative decoding prior to the TPC code word satisfying the CRC if a predetermined number of iterations between the soft decision algorithm and the TPC decoder have been completed.

7. The method of claim 1, further comprising:
performing an error correcting code (ECC) on the decoded TPC code word.

8. The method of claim 1, and before the step of iteratively decoding the TPC code word, further comprising appending CRC data bits to one of a plurality of code blocks of the TPC code word.

9. The method of claim 8, and after the step of appending the CRC data bits to one of the plurality of code blocks of the TPC code word, further comprising adding a row and a column of parity bits to each of the plurality of code blocks of the TPC code word.

10. A data storage system, comprising:
iterative decoder implementing circuitry having a soft decision algorithm and a turbo product code (TPC) decoder, the circuitry configured to iteratively decode a TPC code word by:
  i) generation of a probability indicative parameter, using the soft decision algorithm, for each of a plurality of sequences of bits from the TPC code word;
  ii) de-interleaving of the TPC code word to generate a de-interleaved TPC code word;
  iii) decoding of the de-interleaved TPC code word, using the TPC decoder, as a function of the probability indicative parameter from the soft decision algorithm to generate a decoded TPC code word; and
  iv) re-interleaving of the decoded TPC code word for use by the soft decision algorithm in updating the probability indicative parameter for each of the plurality of sequences of bits; and
wherein the iterative decoder implementing circuitry is further configured to terminate the iterative decoding when the TPC code word satisfies a cyclic redundancy check (CRC).

11. The data storage system of claim 10, wherein the TPC code word contains 512 bytes of user data.

12. A communication system, comprising:
iterative decoder implementing circuitry having a soft decision algorithm and a turbo product code (TPC) decoder, the circuitry configured to iteratively decode a TPC code word by:
  i) generation of a probability indicative parameter, using the soft decision algorithm, for each of a plurality of sequences of bits from the TPC code word;
  ii) de-interleaving of the TPC code word to generate a de-interleaved TPC code word;
  iii) decoding of the de-interleaved TPC code word, using the TPC decoder, as a function of the probability indicative parameter from the soft decision algorithm to generate a decoded TPC code word; and
  iv) re-interleaving of the decoded TPC code word for use by the soft decision algorithm in updating the probability indicative parameter for each of the plurality of sequences of bits; and
wherein the iterative decoder implementing circuitry is further configured to terminate the iterative decoding when the TPC code word satisfies a cyclic redundancy check (CRC).

13. An apparatus comprising:
an iterative decoder having a soft decision algorithm implementing circuitry and a turbo product code (TPC) decoder, the circuitry configured to iteratively decode a TPC code word by:
  i) generation of a probability indicative parameter, using the soft decision algorithm, for each of a plurality of sequences of bits from the TPC code word;
  ii) de-interleaving of the TPC code word to generate a de-interleaved TPC code word;
  iii) decoding of the de-interleaved TPC code word, using the TPC decoder, as a function of the probability indicative parameter from the soft decision algorithm to generate a decoded TPC code word; and
  iv) re-interleaving of the decoded TPC code word for use by the soft decision algorithm in updating the probability indicative parameter for each of the plurality of sequences of bits;
cyclic redundancy check (CRC) implementing circuitry configured to perform a CRC on the TPC code word; and
wherein the iterative decoder is configured to terminate the iterative decoding when the TPC code word satisfies the CRC.

14. The apparatus of claim 13, wherein the soft decision algorithm implementing circuitry is configured to implement a soft output viterbi algorithm (SOVA).

15. The apparatus of claim 13, wherein the TPC code word is a TPC code word with single parity check (TPC/SPC), and wherein the iterative decoder is configured to iteratively decode a TPC/SPC code word.

16. A method comprising:
providing a plurality of square code blocks of a turbo product code (TPC) code word of user data, the user data having a predefined user data length; and
appending cyclic redundancy check (CRC) data bits to at least one of the plurality of code blocks, the appended CRC data bits extending a length of the code word beyond the user data length to an extended length.

17. The method of claim 16, and further comprising:
iteratively decoding the TPC code word; and
terminating the iterative decoding when the TPC code word satisfies a cyclic redundancy check (CRC).

18. The method of claim 16, wherein the user data length is 4096 bits and the extended length of the code word is greater than 4096 bits.

19. The method of claim 16, further comprising:
iteratively decoding the TPC code word between a soft decision algorithm and a TPC decoder.

20. The method of claim 16, wherein the TPC code word is interleaved for the soft decision algorithm and de-interleaved for the TPC decoder.

* * * * *